United States Patent [19]
Greenberg et al.

[11] Patent Number: 5,065,696
[45] Date of Patent: Nov. 19, 1991

[54] TEMPERATURE CONTROLLED DISTRIBUTOR BEAM FOR CHEMICAL VAPOR DEPOSITION

[75] Inventors: William M. Greenberg, Oregon; Randall L. Bauman, Perrysburg, both of Ohio

[73] Assignee: Libbey-Owens-Ford Co., Toledo, Ohio

[21] Appl. No.: 489,002

[22] Filed: Mar. 6, 1990

Related U.S. Application Data

[63] Continuation-in-part of Ser. No. 245,444, Sep. 16, 1988, abandoned, which is a continuation-in-part of Ser. No. 50,466, May 18, 1987, Pat. No. 4,793,282.

[51] Int. Cl.$^5$ .............................................. C23C 16/00
[52] U.S. Cl. ..................................... 118/718; 118/729; 65/60.1; 65/99.2; 65/182.1
[58] Field of Search ............................. 118/718, 729; 65/60.1–60.8, 99.2, 182.1; 411/338, 339, 383, 546, 909, 916

[56] References Cited

U.S. PATENT DOCUMENTS

| 3,888,649 | 6/1975 | Simhan | 65/60.3 |
| 4,019,887 | 4/1977 | Kirkbride | 65/99.2 |
| 4,100,962 | 7/1988 | Housman | 164/435 |
| 4,793,282 | 12/1988 | Greenberg | 118/718 |

Primary Examiner—Richard Bueker
Attorney, Agent, or Firm—Marshall & Melhorn

[57] ABSTRACT

A distributor beam for depositing coating material on the surface of a sheet of glass includes a plenum for each gas to be mixed. The plenums are surrounded by a cooling fluid duct and heating elements are provided for temperature control. Theremocouples generate signals representing actual temperatures and the heaters are controlled to maintain an optimum temperature for the gases as they flow from the plenums through a mixing chamber to the surface of the glass sheet which is located below an outlet from the mixing chamber. Fastener means apply increased clamping pressure to the beam structure as the temperature increases to increase the rate of heat transfer to the cooling fluid.

3 Claims, 3 Drawing Sheets

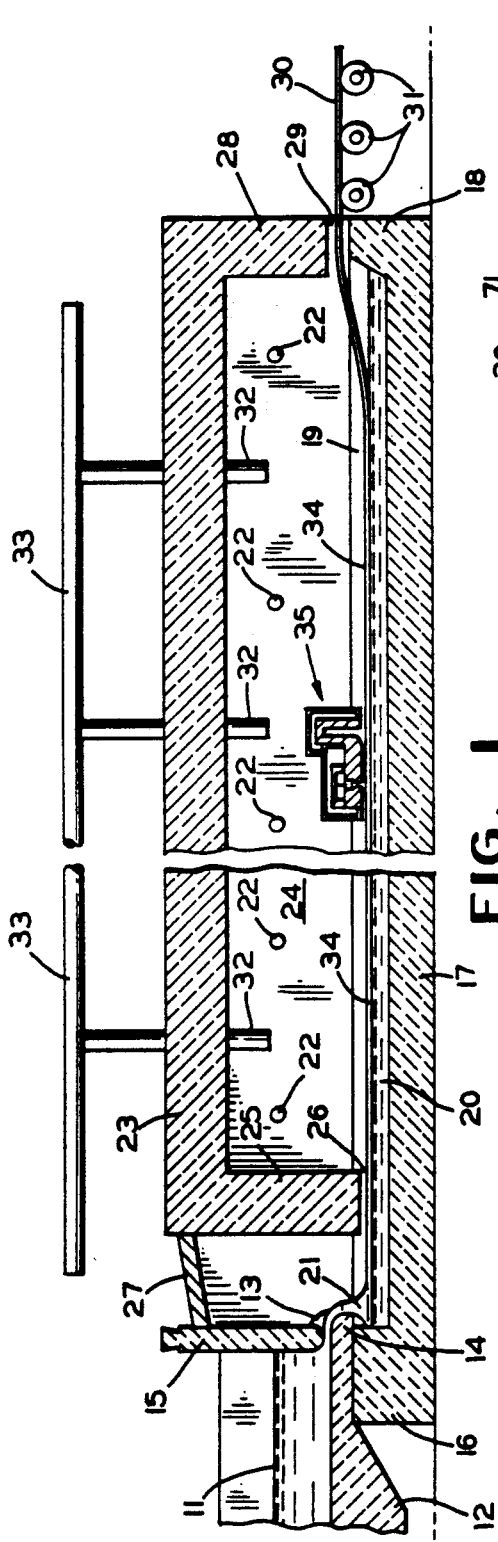
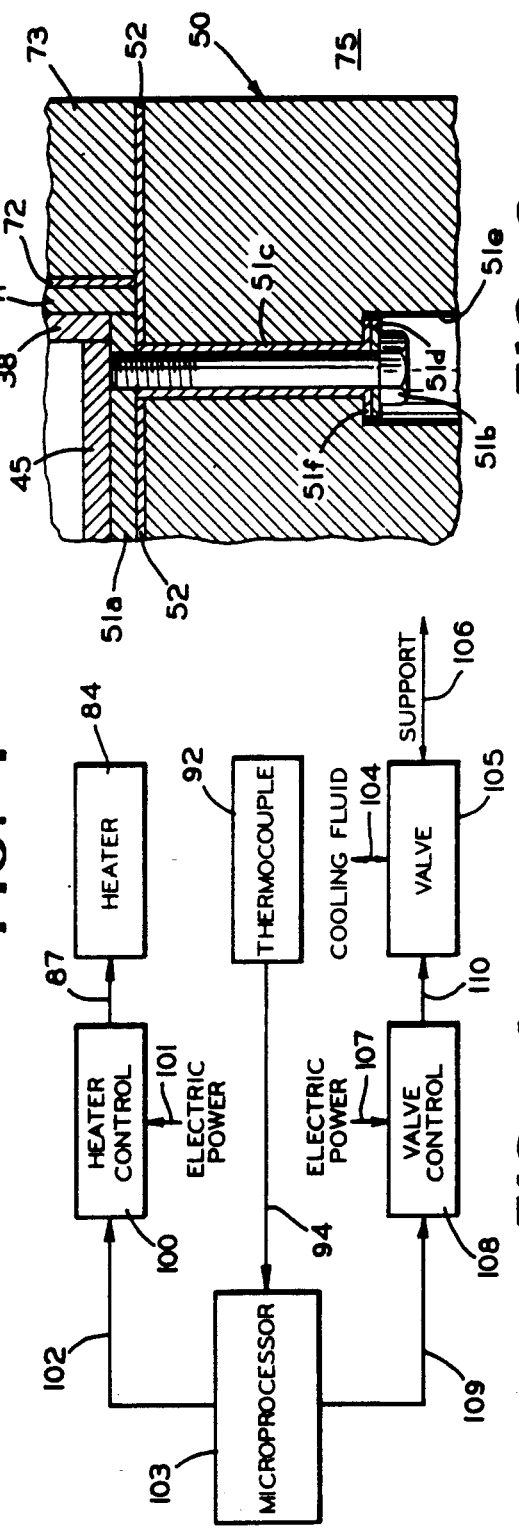

TEMPERATURE CONTROLLED DISTRIBUTOR BEAM FOR CHEMICAL VAPOR DEPOSITION

This application is a continuation-in-part of application Ser. No. 07/245,444, filed Sept. 16, 1988, now abandoned, which is a continuation-in-part of application Ser. No. 07/50,466 filed May 18, 1987, now U.S. Pat. No. 4,793,282.

BACKGROUND OF THE INVENTION

The invention relates generally to an apparatus for coating glass and, in particular, to a temperature controlled distributor beam for chemical vapor deposition on glass.

One method of coating flat glass is by contacting the glass with a gaseous coating material at substantially atmospheric pressure. However, it has been difficult to achieve uniform coatings on a moving glass ribbon by known techniques. In U.S. Pat. No. 3,850,679, it is proposed to enhance the uniformity of films produced by chemical vapor deposition by directing coating gas onto the glass surface through a nozzle at a Reynolds number of at least 2,500. For speed coating a continuous ribbon or sheet of glass, a Reynolds number of at least 5,000 for the flowing gas is recommended. The use of a Reynolds number above 2,500 means that the gas flow is turbulent.

A more satisfactory method of obtaining a uniform coating is to cause the coating gas to flow substantially parallel to the surface of a moving ribbon of glass to be coated under laminar flow conditions as opposed to turbulent flow conditions. A method and apparatus for achieving laminar flow conditions is disclosed in U.S. Pat. No. 4,469,045. The coating gas is directed onto a surface to be coated by a distributor extending across the upper surface of a moving ribbon of glass and across the direction of movement of the ribbon. This device is especially useful for applying a coating from a gas which reacts on contacting the hot glass surface to deposit a coating material on the glass, such as a metal vapor. The temperature of the gas supply and the distributor is preferably kept sufficiently high to prevent condensation of the coating gas, but sufficiently low to prevent any substantial decomposition or other deleterious reactions of the coating gas before the coating gas reaches the glass surface.

The precise temperature control required for proper coating is difficult to obtain. Current systems attempt to maintain the optimum temperature by cooling the distributor with high pressure steam, water, oil, or gas. Such systems are complicated, expensive and often dangerous to operate.

SUMMARY OF THE INVENTION

The present invention concerns a method of and an apparatus for coating flat glass utilizing a distributor beam positioned above a moving ribbon of hot glass. Two or more separate reactant gases are each directed to a separate plenum formed in the interior of the beam which plenums are divided by one or more septums. The gases are separated by the septum as they flow from the plenums and through flow distributing mechanisms such as separate waffle packs or baffle stacks to insure a uniform distribution across the width of the glass ribbon. The temperature of the plenums and thus of the gases in the plenums is controlled with water cooling and electric heaters.

The gases exiting the flow distributing mechanisms enter a channel or duct which extends the length of the distributor beam and opens toward the upper surface of the glass ribbon. Thorough mixing of the gases in the duct is achieved by a unique finger baffle in single or multiple stages. The duct is defined by blocks of material having relatively high thermal conductivity which are insulated from the water cooled plenums and include electric heaters with thermocouple feedback. The plenums and the blocks are surrounded by and attached to a water jacket and support. The means for fastening the plenums and the blocks to the water jacket and support and the insulating material are selected to maintain temperature compensating contact pressure and heat transfer rates respectively. The temperature of the blocks is maintained at a desired level by controlled heat transfer to the water cooled jacket and support around the plenum and by the use of the electric heaters.

BRIEF DESCRIPTION OF THE DRAWINGS

The above, as well as other advantages of the present invention, will become readily apparent to those skilled in the art from the following detailed description of a preferred embodiment when considered in the light of the accompanying drawings, in which:

FIG. 1 is a side elevational view of a float glass manufacturing apparatus shown in cross-section and including a distributor beam in accordance with the present invention;

FIG. 3 is an enlarged fragmentary view of one of the temperature compensated fasteners shown in FIG. 2;

FIG. 4 is a block diagram of the control system for the distributor beam shown in FIG. 1.

DESCRIPTION OF THE PREFERRED EMBODIMENT

Figure 2:
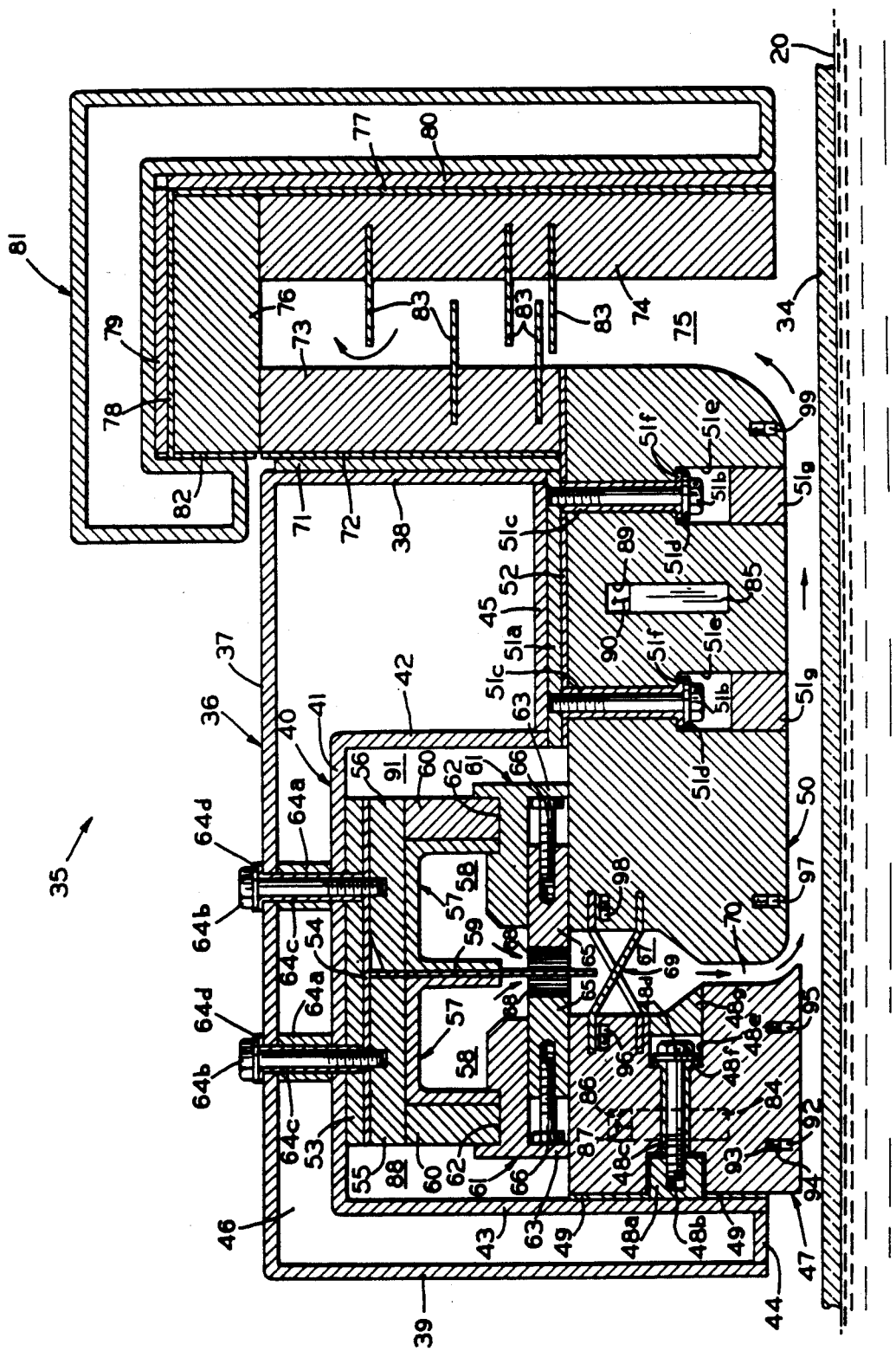
FIG. 2 is an enlarged side elevational cross-sectional view of the distributor beam shown in FIG. 1.

A distributor beam in accordance with the present invention can be utilized in applying a uniform coating to the upper surface of a ribbon of float glass. The position of the distributor beam with respect to the inlet and outlet ends of a bath upon which the ribbon floats depends upon the optimum temperature of the glass in relation to the material being deposited. The beam can also be utilized in the lehr if the temperatures and the ambient atmosphere are suitable for coating chemistry. In FIG. 1, molten glass 11 is delivered in a conventional manner along a canal 12 leading from the outlet of a glass melting furnace (not shown). The canal 12 terminates in a spout having side jambs 13 and a lip 14. The flow of the molten glass to the spout, usually soda. lime-silica glass, is controlled by a regulating tweel 15. The spout extends over an inlet end wall 16 of a tank structure comprising a floor 17, an outlet end wall 18 and sidewalls 19.

The tank structure contains a bath of molten metal 20, usually molten tin or tin alloy in which tin predominates, and molten glass flows at 21 over the spout lip 14 onto the surface of the molten metal bath 20 at the inlet of the bath. The temperature at the inlet is maintained in the region of one thousand degrees centigrade by heaters 22 mounted in a roof structure 23 which is supported over the tank structure and defines a head space 24 above the molten metal bath. The roof structure has an inlet end wall 25 which depends downwardly close to the surface of the molten bath 20 to define an inlet 26 of restricted height. An extension 27 of the roof structure 23 extends up to the tweel 15 to provide a chamber in which the spout is enclosed.

The roof structure 23 also has a downwardly depending wall 28 at the outlet end. An outlet 29 for a ribbon of glass 30 produced on the bath is defined between the lower face of the outlet end wall 28 of the roof structure and the upper face of the outlet end wall 18 of the bath. Driven traction rollers 31 are mounted beyond the outlet 29 with the upper surfaces of the rollers just above the level of the upper surface of the bath end wall 18 so that the ribbon of glass 30 is lifted gently from the bath surface for discharge horizontally away from the outlet 29 on the rollers 31.

A protective atmosphere, for example, 95% nitrogen and 5% hydrogen, is maintained at a plenum in the head space 24 over the bath, being supplied through ducts 32 extending downwardly through the roof 23 and connected to a common header 33. Protective atmosphere flows outwardly through the inlet 26 to fill the chamber under the extension 17 enclosing the spout.

A temperature gradient is maintained down the bath from the temperature of about one thousand degrees centigrade at the inlet end of the bath to a temperature in the range of about five hundred seventy degrees centigrade to six hundred fifty degrees centigrade at the outlet end where the ribbon of glass is discharged from the bath. At this lower temperature at the outlet, the glass 30 is sufficiently stiffened to be unharmed by its contact with the traction rollers 31, but can still be lifted from the bath surface as illustrated.

The molten glass 11, which flows over the spout lip 14 and onto the bath at 21, is permitted to flow laterally on the bath to form a layer 34 of molten glass which is then advanced as a ribbon which is cooled and discharged from the bath. The width of the tank structure containing the bath between the sidewalls 19 is greater than the width of the ribbon.

A gas distributor beam 35 for supplying coating gas to the surface of the glass ribbon is located transversely of the path of travel of the ribbon of glass along the bath near the outlet end of the bath as illustrated in FIG. 1. The distributor thus extends across the upper surface of the ribbon of glass and across the direction of movement of the ribbon. The gas distributor beam 35 is illustrated in greater detail in FIG. 2.

The gas distributor beam 35 includes an inverted generally U-shaped channel member 36 having a substantially horizontal top wall 37, and downwardly depending side walls 38 and 39 facing the outlet end and the inlet end of the bath respectively. Within the channel member 36 is positioned another inverted U-shaped channel member 40 having a generally horizontally extending top wall 41, and downwardly depending side walls 42 and 43 facing the outlet end and the inlet end of the bath respectively. The lower ends of the side walls 39 and 43 are joined by a horizontal member 44 which can be attached by any convenient means such as welding. The lower ends of the side walls 38 and 42 are similarly attached to a horizontal member 45. Thus, the channel member 36, the channel member 40, the horizontal members 44 and 45, an end wall 46, and an opposite end wall (not shown) form a support which defines a jacket or duct for the passage of heat transfer fluids such as water. Although not shown, conventional inlet and outlet means can be connected to the support for supplying the heat transfer fluid at a lower temperature to the duct and removing the heat transfer fluid at a higher temperature from the duct. Also, one or more partitions could be formed in the duct for defining separate passages for the heat transfer fluid. For example, a generally vertically extending wall could be formed between the top wall 37 and the horizontal member 45 to divide the area between the side walls 38 and 42 into separate passages with the area closer to the side wall 42 being for inlet heat transfer fluid and the area closer to the side wall 38 being for outlet heat transfer fluid flowing in opposite directions.

The support defining the fluid duct is attached to a pair of blocks formed of a relatively high thermal conductivity material defining an outlet passage for the coating gas to be directed toward the upper surface of the layer of molten glass 34 floating on the surface of the molten metal 20. For example, a lead-toe block 47 has a generally vertically extending surface which faces the side wall 43. An attachment block 48a is attached to the side wall 43 and a sheet of insulating material 49 is positioned around the attachment block 48a between the side wall 43 and the lead-toe block 47. The lead-toe block 47 can be attached to the side wall 43 by a plurality of cooled fastener means. For example, a threaded fastener 48b extends generally horizontally through an aperture formed in the block 47 and threadably engages a threaded aperture formed in the attached block 48a. The fastener 48b can also extend through a bushing 48c positioned in the aperture in the block 47 and a washer 48d can be positioned under the head of the fastener 48b. Thus, the fastener 48b does not directly contact the block 47. Of course, a plurality of such cooled fastener means can be spaced apart between opposite ends of the block 47.

Similarly a center block 50 is attached along an upper surface to the horizontal member 45 by a generally horizontally extending attachment plate 51a and cooled fastener means. The plate 51a is attached to the member 45 by any suitable means such as welding and a sheet of insulating material 52 is positioned between the block 50 and the attachment plate 51a. A pair of threaded fasteners 51b extend through the block 50 and the insulating material 52 and threadably engage threaded apertures formed in the attachment plate 51a. Each of the fasteners 51b can also extend through a bushing 51c retained in the aperture in the block 50 and a washer 51d can be positioned under the head of the fastener 51b. A plurality of such cooled fastener means can be spaced apart between ends of the block 50.

A spacer plate 53 is attached to a downwardly facing surface of the top wall 41. A sheet of insulating material 54 is attached to a downwardly facing surface of the spacer plate 53 and a pair of attachment blocks 55 and 56 are positioned adjacent a downwardly facing surface of the insulating material 54. A pair of inverted U-shaped channel members 57 form a pair of adjacent plenums 58. Each of the channel members 57 has a top wall attached to a downwardly facing surface of one of the attachment blocks 55 and 56 and downwardly extending side walls. The attachment blocks 55 and 56 and the inner side walls of the channel members are separated by a downwardly extending septum 59 which has an upper edge abutting the insulating material 54. The outer sidewalls of the channel members 57 abuts associated side block 60. Each of the side blocks 60 has an upper surface which abuts the downwardly facing surface of a respective one of the attachment blocks 55 and 56.

A pair of support plates 61 each have an upwardly facing recess 62 formed therein for retaining the lower edges of the outer side walls of the channel members 57 and the lower edges of the side blocks 60. The side blocks can be attached to the support plates by threaded fasteners (not shown). Each of the support plates 61 also has a downwardly extending flange 63 which flanges abut the upper surfaces of the lead-toe block 47 and the center block 50. Thus, the spacer plate 53, the insulating material 54, the attachment blocks 55 and 56, the U-shaped channels 57, the side blocks 60, and the support plate 61 form a plenum structure which extends between the downwardly facing surfaces of the top wall 41 and the upwardly facing surfaces of the blocks 47 and 50 and is positioned between the side walls 42 and 43. The plenum structure is attached to the cooling jacket by cooled fastener means. A pair of spacers 64a are positioned between the top walls 37 and 41 to prevent movement of the walls toward one another when the fastener means are tightened. A threaded fastener 64b extends through the top wall 37, one of the spacers 64a, the top wall 41, the spacer plate 53, and the insulating material 54 and threadably engages the attachment block 55. The fastener 64b can also pass through a bushing 64c which extends from the outer surface of the top wall 37 to the insulating material 54. A washer 64d can be provided under the head of the fastener 64b. A plurality of such cooled fastening means are provided spaced from end to end of the beam 35.

A pair of waffle irons 65 are positioned between a downwardly facing surface of each of the support plates 61 and an upwardly facing surface of the blocks 47 and 50. Horizontally extending positioning blocks 66 are threadably engaged in the side surfaces of the waffle irons and each of the positioning bolts 66 has a head abutting an inwardly facing surface of a corresponding one of the flanges 63 which flanges function as thrust plates. Thus, by rotating the positioning bolts 66, the waffle irons 65 can be moved toward or away from facing sides of the septum 59 which extends between the waffle irons 65 and into a mixing chamber 67 defined between the lead-toe block 47 and the central block 50. A pair of waffle packs 68 are positioned between the septum 59 and each of the waffle irons 65. Typically, a one half to one inch extension of the septum is necessary to prevent clogging of the waffle packs.

The waffle packs 68 are representative of known types of flow uniformizing means which define a plurality of channels of small cross-sectional area relative to the cross-sectional area of the plenums 58. Thus, when coating gas is supplied under pressure to the plenums 58, the pressure drop along the plenums is small compared to the pressure drop through the restricted channels of the waffle packs 68. The waffle packs effectively constitute gas flow restrictor means to insure release of coating gas at a substantially constant pressure and temperature along the whole of its length, and hence uniformly across the width of the glass to be coated. As shown by the arrows, the gases supplied to the plenums 58 are separated by the septum 59 and flow through associated ones of the waffle packs 68 into the upper portion of the mixing chamber 67.

The two separate gases from the plenums 58 enter the upper portion of the mixing chamber 67 and contact a finger baffle 69 which extends across the width of the mixing chamber 67. The finger baffle 69 includes two sets of alternating angle fingers extending across the width of the mixing chamber 67 and having opposite ends secured in the blocks 47 and 50.

Gas flowing from either of the plenums 58 through the associated waffle pack 68 first encounters one end of the fingers closer to the plenum outlet. Half of the gas will strike the fingers and be directed towards the opposite side of the mixing chamber 67. The half of the gas will flow between the fingers and strike the lower ends of the other set of fingers. Thus, the two gas streams are split into multiple streams and redirected to thoroughly mix the two gases which mixture exits the bottom of the finger baffle 69 and flows into a distribution slot 70 defined between the facing surfaces of the blocks 47 and 50.

The lead-toe block 47 extends below the lower surface of the central block 50 and is shaped to redirect the vertically downwardly flowing gas (arrows) to a horizontal laminar flow between the lower surface of the central carbon block 50 and the upper surface of the sheet of molten glass 34. In FIG. 2, the sheet 34 is moving in the direction of the arrows and tends to pull the gas along with it from the side of the carbon block 50 defining the mixing chamber 67 and the distribution slot 70 toward the opposite side to which there is attached a means for collecting that portion of the gas mixture which is not deposited on the surface of the sheet 34. The collection means can be an integral baffle stack extractor formed of high thermal conductivity blocks surrounded and supported by a water cooled support supplied with fluid in a manner similar to the previously described support for the blocks 47 and 50.

A generally vertically extending attachment plate 71 is attached to an exterior surface of the side wall 38. A generally vertically extending sheet of insulating material 72 abuts an outer surface of the attachment plate 71 and has a lower edge resting upon an upper surface of the insulating material 52. The center block 50 and the insulating material 52 extend beyond the side wall 38 toward the outlet end of the bath to provide support for a lower edge of a generally vertically extending side wall block 73. Spaced from the side wall block 73 is a generally vertically extending second side wall block 74 such that an extraction chamber 75 is formed between the blocks 73 and 74. The extraction chamber 75 is open at the bottom for receiving the gas mixture which is not deposited on the surface of the sheet 34 and is closed at its upper end by a generally horizontally extending top wall block 76 resting on the upper ends of the side wall block 73 and 74.

The upper end of the sheet of insulating material 72 abuts one side of the top wall block 76 and another sheet of insulating material 77 abuts the other side of the top wall block 76 and the outer side surface of the side wall block 74. A generally horizontally extending sheet of insulating material 78 abuts the upper surface of the top wall block 76. A generally horizontally extending attachment plate 79 extends across the upper surface of the insulating material 78 and a generally vertically extending attachment plate 80 abuts the outer surface of the insulating material 77. A water cooled support 81 has an inverted J shape cross-section. The support 81 is attached to the outer surfaces of the attachment plates 79 and 80 by any suitable means. The top wall block 76 is attached to the support 81 by suitable fastener means which extend through the insulating material 78 and threadably engage the attachment plate 79. The side wall block 74 is attached to the support 81 by similar fastener means which extend through the insulating material 77 and threadably engage the attachment plate 80. A generally vertically extending sheet of insulating material 82 abuts a side surface of the top wall block 76 and is retained against the block 76 by the support 81. A plurality of generally horizontally extending baffles 83 are attached to and extend outwardly from the side wall blocks 73 and 74 into the extraction chamber 75. The baffles typically extend from alternate sides and are spaced progressively farther apart from the bottom to the top of the chamber 75.

The cooled threaded fastener closest to the extraction chamber 75 is shown in enlarged form in FIG. 3. The aperture extending through the center block 50 has an enlarged opening 51e for retaining a flanged end 51f of the bushing 51c. The enlarged opening 51e is closed by a plug 51g as shown in FIG. 2. In a similar manner an enlarged opening 48e for the threaded fastener 48b can be closed by a plug 48g having the contours of the mixing chamber 67.

In order to maintain a proper temperature for depositing the coating material on the surface of the sheet 34 and minimizing undesirable deposits on the blocks 47 and 50, each of the blocks 47 and 50 can be provided with a plurality of heating means such as a heater 84 positioned in the block 47 and a heater 85 positioned in the block 50. The heater 84 is located in a recess 86 formed in the block 47 and is connected to a power lead 87 which in turn is connected to control apparatus (shown in FIG. 4) for supplying electrical power to the heater. The control apparatus can be located remotely from the beam and the lead 87 can extend through the block 47 and through a wire duct 88 formed between the side wall 43 and the side block 60—support plate 61 structure. Similarly, the heater 85 is located in a recess 89 formed in the block 50 and is connected to a power lead 90 which in turn is connected to the control apparatus. The lead 90 can extend through the block 50 and through a wire duct 91 formed between the side wall 42 and the side block 60—support plate 61 structure.

A thermocouple 92 can be positioned in a recess 93 formed in the block 47. The thermocouple 92 can be connected to a signal lead 94 which in turn is connected to the control apparatus shown in FIG. 4 through the wire duct 88. Thus, the heater 84 can be controlled in accordance with the temperature sensed by the thermocouple 92 to maintain a desired temperature in the block 47 adjacent the upper surface of the strip of molten glass 34. Similarly, a thermocouple 95 can be located in a recess formed in the block 47 adjacent the distribution slot 70 and a thermocouple 96 can be located in a recess formed in the block 47 adjacent the finger baffle 69. Thermocouples 97 and 98, corresponding to the thermocouples 95 and 96 respectively, and a thermocouple 99 adjacent the inlet to the extraction chamber 75 are located in recesses formed in the block 50. Thus, the control apparatus can control the power supplied to the heater 89 in accordance to the temperature sensed by the thermocouples 97, 98 and 99 in order to maintain a desired temperature between the carbon block 50 and the upper surface of the sheet of molten glass 34.

The distributor beam 35 includes both cooling and heating means for maintaining the optimum temperature for the coating gases both in the plenums 58 and adjacent the surface to be coated on the sheet of molten glass 34. As shown in FIG. 4, the heater 84 is connected by the power lead 87 to a heater control 100. The heater control 100 is a conventional unit which is connected to a source of electrical power (not shown) by a line 101. The heater control 100 receives signals on a signal line 102 connected to a temperature controller such as a microprocessor 103 for controlling the amount of electric power supplied to the heater 84 thereby controlling the heat applied to the block 47. The thermocouple 92 is connected by the lead 94 to an input of the microprocessor 103 to provide information about the temperature of the block 47. Although not shown, the thermocouples 95 and 96 are connected in a similar manner to the microprocessor 103. Furthermore, the heater 84 is representative of one of a plurality of such heaters which can be spaced from end to end of the block 47. Of course, the heater 85 and the thermocouples 97, 98 and 99 in the block 50 can be connected in a similar manner for controlling the temperature of the block 50. The temperature controller microprocessor 103 responds to the temperature signals generated by the thermocouples and set point temperature signals inputted and stored to generate the control signals to the heater controls.

As was previously stated, the cooling fluid for the water cooled supports flows into and out of the ducts formed in the supports. For example, a fluid line 104 can be connected between a source of cooling fluid (not shown) and a valve 105. Another fluid line 106 can be connected between the valve 105 and one of the supports. The valve 105 can be any conventional type of valve such as a solenoid operated valve. Thus, a source of electric power (not shown) is connected by a power line 107 to a valve control 108. The valve control 108 receives control signals from the microprocessor 103 on a signal line 109 and applies power to operate the valve 104 on a line 110. The valve 105 and the valve control 108 are representative of elements which could be used on both the inlet and the outlet of each support and a plurality of such elements could be utilized where the supports are divided into multiple chambers.

The present invention maintains the optimum temperature by controlling the heat transfer to the water cooled supports through the selection of suitable insulation and the maintenance of temperature compensating contact pressures between the blocks and the supports. The compensating contact pressures are maintained by the threaded fastening means. For example, the blocks 47 and 50 are typically formed of a graphite reactor material having a thermal coefficient of expansion of approximately "1.3". The threaded fasteners 48b and 51b can be formed of a material having a relatively high coefficient of thermal conductivity. The bushings 48c and 51c can be formed of an insulating material to resist heat transfer from the blocks 47 and 50 to the fasteners 48b and 51b respectively. The fasteners 48b and 51b are cooled by drawing heat from them through the attachment block 48a and the attachment plate 51a respectively and through the side wall 43 and the member 45 respectively to the cooling fluid. Thus, the cooled fasteners 48b and 51b tend not to expand and lengthen as the temperatures rise in the blocks 47 and 50 respectively. However, the blocks 47 and 50 tend to expand between the insulating materials 49 and 52 and the heads of the fasteners 48b and 51b, respectively, thereby increasing the clamping pressure which increases the rate of heat transfer from the blocks to water cooled supports thereby tending to decrease the temperature of the blocks in a self-regulating manner.

The beam 35 is designed to have an equilibrium temperature at the critical surfaces facing the glass layer 34 of approximately fifty to two hundred degrees fahrenheit below the optimum temperature. The heaters 84 and 85 are then utilized to bring the temperature of the critical surfaces up to the optimum temperature. One advantage of the present system is that it can utilize a conventional non. pressurized water source with the water temperature between freezing and boiling. Such a cooling source has the advantages of being less hazardous to operating personnel and does not cause pollution problems.

Figure 5:
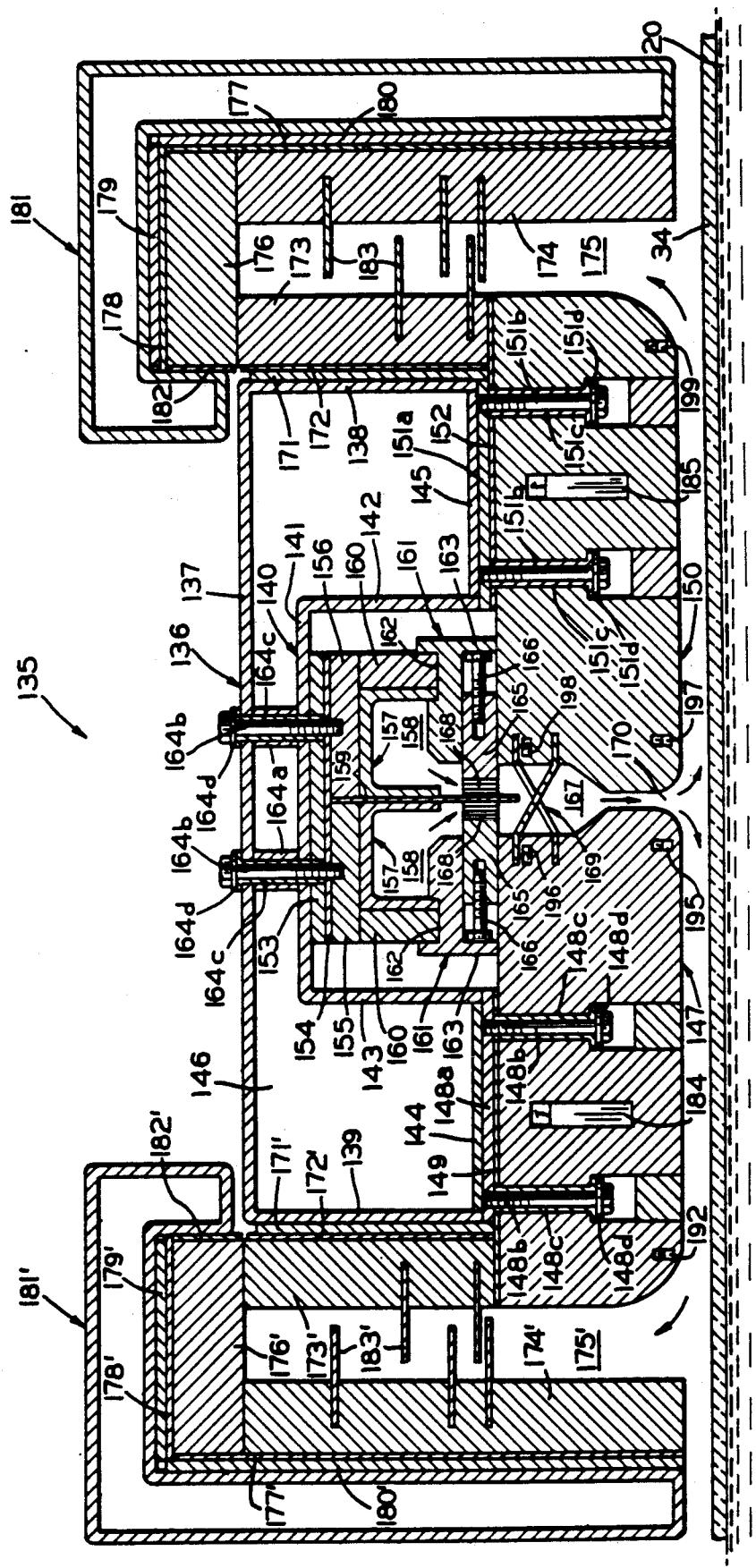
FIG. 5 is a side elevational cross-sectional view of an alternate embodiment of the distributor beam shown in FIG. 1.

There is shown in FIG. 5 an alternate embodiment of the gas distributor beam 35 of FIG. 2. A dual flow beam 135 includes a leading edge which is a mirror image of the trailing edge. An inverted generally U-shaped channel member 136 having a substantially horizontal top wall 137 includes downwardly depending side walls 138 and 139 facing the outlet end and the inlet end of the bath respectively. Within the channel member 136 is positioned another inverted U-shaped member 140 having a generally horizontally extending top wall 141 and downwardly depending side walls 142 and 143 facing the outlet end and the inlet end of the bath respectively. The lower ends of the side walls 139 and 143 are joined by a horizontal member 144 which can be attached by any convenient means such as welding. The lower ends of the side walls 138 and 142 are similarly attached to a horizontal member 145. Thus, the channel member 136, and the channel member 140, the horizontal member 144 and 145, and the end wall 146, and an opposite end wall (not shown) form a support which defines a symmetrical jacket or duct for the passage of heat transfer fluid such as water.

The support defining the fluid duct is attached to a pair of blocks formed of a relatively high thermal conductivity material defining an outlet passage for the coating gas to be directed toward the upper surface of the layer of molten glass 34 floating on the surface of the molten metal 20. For example, the lead-toe block 47 of FIG. 2 is replaced by a lead center block 147 which is a mirror image of the center block 50 of FIG. 2. Similarly a trailing center block 150 is similar to the center block 50 of FIG. 2. The lead center block 147 is attached along an upper surface to the horizontal member 144 by a generally horizontally extending attachment plate 148a and cooled fastener means. The plate 148a is attached to the member 144 by any suitable means such as welding and a sheet of insulating material 149 is positioned between the block 147 and the attachment plate 148a. A pair of threaded fasteners 148b extend through the block 147 and the insulating material 149 and threadably engage threaded apertures formed in the attachment plate 148a. Each of the fasteners 148b can also extend through a bushing 148c retained in the aperture in the block 147 and a washer 148d can be positioned under the head of the fastener 148b. A plurality of such cooled fastener means can be spaced apart between ends of the block 147.

Similarly the trailing center block 150 is attached along an upper surface to the horizontal member 145 by a generally horizontally extending attachment plate 151a and cooled fastener means. The plate 151a is attached to the member 145 by any suitable means such as welding and a sheet of insulating material 152 is positioned between the block 150 and the attachment plate 151a. A pair of threaded fasteners 151b extend through the block 150 and the insulating material 152 and threadably engage threaded apertures formed in the attachment place 151a. Each of the fasteners 151b can also extend through a bushing 151c retained in the aperture in the block 150 and a washer 151d can be positioned under the head of the fastener 151b. A plurality of such cooled fastener means can be spaced apart between ends of the block 150.

A spacer plate 153 is attached to a downwardly facing surface of the top wall 141 and a sheet of insulating material 154 is attached to a downwardly facing surface of the spacer plate 153. A pair of attachment blocks 155 and 156 are positioned adjacent a downwardly facing surface of the insulating material 154. A pair of inverted U-shaped channel members 157 form a pair of adjacent plenums 158. Each of the channel members 157 has a top wall, attached to a downwardly facing surface of one of the attachment blocks 155 and 156, and downwardly extending side walls. The attachment blocks 155 and 156 and the inner side walls of the channel members 157 are separated by a downwardly extending septum 159 which has an upper edge abutting the insulating material 154. The outer side walls of the channel members 157 abut associated side blocks 160. Each of side blocks 160 has an upper surface which abuts the downwardly facing surface of a respective one of the attachment blocks 155 and 156.

A pair of support plates 161 each have an upwardly facing recess 162 formed therein for retaining the lower edges of the outer side walls of the channel members 157 and the lower edges of the side blocks 160. The side blocks can be attached to the support plates by threaded fasteners (not shown). Each of the support plates 161 also has a downwardly extending flange 163 which flanges abut the upper surfaces of the lead center block 147 and the trailing center block 150. A pair of spacers 164a are positioned between the top walls 137 and 141 to prevent movement of the walls toward one another when the fastening means are tightened. A threaded fastener 164b extends through the top wall 137, one of the spacers 164a, the top wall 141, the spacer plate 153, and the insulating material 154 and threadably engages the attachment block 155. The fastener 164b can also pass through a bushing 164c which extends from the outer surface of the top wall 137 to the insulating material 154. A washer 164d can be provided under the head of the fastener 164b. A plurality of such cooled fastening means are provided spaced from end to end of the beam 135.

A pair of waffle irons 165 are positioned between a downwardly facing surface of each of the support plates 161 and an upwardly facing surface of the blocks 147 and 150. Horizontally extending positioning bolts 166 are threadably engaged in the side surfaces of the waffle irons and each of the positioning bolts 166 has a head abutting an inwardly facing surface of a corresponding one of the flanges 163 which flanges function as thrust plates. Thus, by rotating the positioning bolts 166, the waffle irons 165 can be moved toward or away from the facing sides of the septum 159 which extends between the waffle irons 165 and into a mixing chamber 167 defined between the blocks 147 and 150. A pair of waffle packs 168 are positioned between the septum 159 and each of the waffle irons 165. Typically, a one half to one inch extension of the septum is necessary to prevent clogging of the waffle packs. The two separate gases from the plenums 158 enter the upper portion of the mixing chamber 167 and contact a finger baffle 169 which extends across the width of the mixing chamber 167. The two gas streams are thoroughly mixed and the mixture exits the bottom of the finger baffle 169 and flow into a distribution slot 170 defined between the facing surfaces of the blocks 147 and 150.

The distribution slot 170 opens to the upper surface of a sheet of molten glass 34. The blocks 147 and 150 are shaped to redirect the vertically downwardly flowing gas (arrows) to a horizontal laminar flow between the lower surfaces of the blocks 147 and 150 and the upper surface of the sheet of molten glass 34. Adjacent the sides of the blocks 147 and 150 opposite the distribution slot 170 are means for collecting that portion of the gas mixture which is not deposited on the surface of the sheet 34.

A generally vertically extending attachment plate 171 is attached to an exterior surface of the side wall 138. A generally vertically extending sheet of insulating material 172 abuts an outer surface of the attachment plate 171 and has a lower edge resting upon an upper surface of the insulating material 152. The trailing center block 150 and the insulating material 152 extend beyond the side wall 138 toward the outlet end of the bath to provide support for a lower edge of a generally vertically extending side wall block 173. Spaced from the side wall block 173 is a generally vertically extending second side wall block 174 such than an extraction chamber 175 is formed between the blocks 173 and 174. The extraction chamber 175 is open at the bottom for receiving the gas mixture which is not deposited on the surface of the sheet 34 and is closed at its upper end by a generally horizontally extending top wall block 176 resting on the upper ends of the side wall blocks 173 and 174.

The upper end of the sheet of insulating material 172 abuts one side of the top wall block 176 and another sheet of insulating material 177 abuts the other side of the top wall block 176 and the outer side surface of the side wall block 174. A generally horizontally extending sheet of insulating material 178 abuts the upper surface of the top wall block 176. A generally horizontally extending attachment plate 179 extends across the upper surface of the insulating material 178 and a generally vertically extending attachment plate 180 abuts the outer surface of the insulating material 177. A water cooled support 181 has an inverted J-shape cross section. The support 181 is attached to the outer surfaces of the attachment plates 179 and 180 by any suitable means. The top wall block 176 is attached to the support 181 by suitable fastener means which extend through the insulating material 178 and threadably engaged the attachment plate 179. The side wall block 174 is attached to the support 181 by similar fastener means which extend through the insulating material 177 and threadably engage the attachment plate 180. A generally vertically extending sheet of insulating material 182 abuts a side surface of the top wall block 176 and is retained against the block 176 by the support 181. A plurality of generally horizontally extending baffles 183 are attached to and extend outwardly from the side wall blocks 173 and 174 into the extraction chamber 175. The baffles typically extend from alternate sides and are spaced progressively farther apart from the bottom to the top of the chamber 175. A similar collection means is attached to the beam 135 facing toward the inlet end of the bath. Such collection means is identified by reference numerals 171' through 183' corresponding to the elements identified by the reference numerals 171 through 183 respectively.

In order to maintain a proper temperature for depositing the coating material on the surface of the sheet 34 and minimizing undesirable deposits on the blocks 147 and 150, each of the blocks 147 and 150 can be provided with a plurality of heating means such as heater 184 positioned in the block 147 and a heater 185 positioned in the block 150. In order to sense the temperatures in the blocks, a plurality of thermocouples 192, 195 and 196 can be provided in the block 147 and a similar plurality of thermocouples 197, 198 and 199 can be provided in the block 150. A control similar to the control shown in FIG. 4 can be utilized with the distributer beam 135.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. An apparatus for depositing a coating material on a surface of a glass sheet comprising:
   at least a pair of plenums for receiving separate coating gases and each having an outlet;
   a mixing chamber having an inlet connected to said plenum outlets and an outlet adapted to be positioned adjacent a surface of a sheet of glass to be coated, said mixing chamber being defined by spaced apart walls of blocks of material having a relatively high thermal conductivity;
   a support defining a cooling fluid duct;
   insulating material positioned between said plenums and said support and between said blocks and said support; and
   cooled fastener means for attaching said plenums, said blocks and said insulating material to said support including a threaded fastener extending through said blocks and said insulating material and threadably engaging said support, a bushing extending between a head of said threaded fastener and said support and through which said threaded fastener extends, said threaded fastener having a relatively high coefficient of thermal conductivity, and said bushing being formed of an insulating material.

2. The apparatus according to claim 1, including a washer positioned between said head of said threaded fastener and said bushing and through which said threaded fastener passes.

3. The apparatus according to claim 2 wherein said bushing has a radially outwardly extending flange formed at an end adjacent said head of said threaded fastener, said threaded fastener and said bushing extending through an aperture formed in said blocks, said aperture having an enlarged opening for retaining said flanged end of said bushing and said head of said threaded fastener, and including a plug closing said enlarged opening of said aperture.

* * * * *